(12) United States Patent
Hayakawa et al.

(10) Patent No.: US 6,255,365 B1
(45) Date of Patent: Jul. 3, 2001

(54) EPOXY RESIN COMPOSITION FOR SEMICONDUCTOR ENCAPSULATION

(75) Inventors: Atsuhito Hayakawa; Yasuyuki Murata, both of Yokkaichi (JP)

(73) Assignee: Shell Oil Company, Houston, TX (US)

( * ) Notice: Subject to any disclaimer, the term of this patent is extended or adjusted under 35 U.S.C. 154(b) by 0 days.

(21) Appl. No.: 09/360,963

(22) Filed: Jul. 27, 1999

(30) Foreign Application Priority Data

Jul. 28, 1998 (JP) .................................................. 10-244331

(51) Int. Cl.[7] .............................. C08K 3/36; C08L 63/04

(52) U.S. Cl. ........................... 523/427; 523/466; 528/89; 528/94; 528/103; 528/104

(58) Field of Search ................................ 528/89, 94, 103, 528/104; 523/466, 427

(56) References Cited

U.S. PATENT DOCUMENTS 4,701,481 * 10/1987 Bogar et al. ........................ 523/428

* cited by examiner

*Primary Examiner*—Robert Dawson
*Assistant Examiner*—D. Aylward
(74) *Attorney, Agent, or Firm*—Y. Grace Tsang

(57) ABSTRACT

An epoxy resin composition comprising
(a) an epoxy resin comprising a mixture of the following components:
  (1) about 50–95 parts by weight of a novolak type epoxy resin, and
  (2) about 5–50 parts by weight of 4,4'-biphenol type epoxy resin
(b) a phenolic resin represented by the general formula (II)

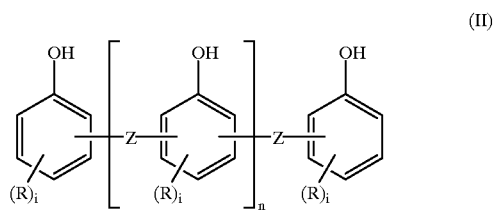

(where R, which may be the same or different, represents an alkyl group having 1–10 carbon atoms, a substituted or unsubstituted phenyl group, a substituted or unsubstituted aralkyl group, an alkoxyl group or a halogen atom; Z, which may be the same or different, represents a divalent hydrocarbon group having 1–15 carbon atoms, provided that at least one Z is a divalent hydrocarbon group having 5–15 carbon atoms; n is a number of 0–8 on the average value; and i, which may be the same or different, is an integer of 0–3) as an epoxy resin hardener,
(c) an inorganic filler, and
(d) a curing accelerator.

19 Claims, No Drawings

EPOXY RESIN COMPOSITION FOR SEMICONDUCTOR ENCAPSULATION

FIELD OF THE INVENTION

The present invention relates to an epoxy resin composition for semiconductor encapsulation, which cures rapidly, has excellent molding fluidity, and results in a cured product exhibiting minimal moisture absorption and excellent solder crack resistance.

BACKGROUND OF THE INVENTION

Epoxy resin compositions are used in a wide variety of fields, such as adhesion, casting, encapsulation, lamination, molding and coating, due to their excellent cured properties and ease of handling. There are a large variety of epoxy resins with greatly varying cured properties. Therefore, epoxy resins should be chosen according to their intended purpose.

In recent years, the requirements for various characteristics of polymeric materials have become more stringent as conditions under which the polymeric materials are used have become more severe. Many commonly used epoxy resins have been unable to accommodate these increased demands.

For example, epoxy resin compositions are used for semiconductor encapsulation. However, the required performance level has increased in this field. As high integration of semiconductor devices has increased, the resulting enlargement of semiconductor elements has been remarkable, creating a need for miniaturized and thinned packages. In addition, mounting of semiconductor devices has shifted to surface mounting. In surface mounting, the semiconductor devices are directly dipped into a solder bath, thus being suddenly exposed to high temperature. Due to rapid expansion of absorbed water, high stress is applied to the whole package, generating cracks in the encapsulating material. For this reason, epoxy resin compositions for encapsulation having good solder crack resistance require high heat resistance (high glass transition temperature), low moisture absorption and low stress property (a small thermal expansion coefficient).

To reduce moisture absorption and improve resistance to thermal stress, a large amount of an inorganic filler such as fused silica powder is commonly used. This significantly improves solder crack resistance. However, if an excessive amount of the inorganic filler is used, fluidity at molding is impaired. For this reason, an epoxy resin for semiconductor encapsulation is required to have a low melt viscosity.

In addition, for use with thinned and miniaturized packages, the epoxy resin for semiconductor encapsulation is also required to have high fluidity, thus the demand for low melt viscosity of the epoxy resin is even greater.

Further, rapid curability is required in order to increase molding speed, and it is the recent trend that materials not having rapid curability are not used even if other characteristics are good.

Novolak type epoxy resins (particularly cresol novolak type epoxy resin) currently in common use have excellent heat resistance and rapid curability, but have been unable to sufficiently meet low moisture absorption and low melt viscosity requirements.

Further, phenol novolak resin currently in common use as an epoxy resin hardener is also insufficient with respect to low moisture absorption and low melt viscosity, although heat resistance and curability properties are excellent.

The use of biphenyl type epoxy resins having a low melt viscosity has been widely investigated. Japanese Patent Application No. Sho 61-47725, for example, describes mixing 20–400 parts by weight of a novolak type epoxy resin per 100 parts by weight of a biphenyl type epoxy resin, and using phenol novolak resin as a hardener, to take up the balance. However, because the heat resistance of these compounds is poor, they are not sufficiently solder crack resistant. Curability and moisture absorption properties of these resins are also insufficient.

Japanese Patent Application No. Hei 7-118366 and Japanese Patent Application No. Hei 7-216054 describe improved solder crack resistance by mixing a novolak type epoxy resin and 50 wt % or more of a tetramethyl biphenyl type epoxy resin in addition to an aralkyl phenol resin which achieves low moisture absorption, as a hardener. However, if tetramethyl biphenyl type epoxy resin, which has poor curability, is added in a large amount, curability is insufficient.

SUMMARY OF THE INVENTION

It is an object of the present invention to provide a novel epoxy resin composition for semiconductor encapsulation, having rapid curability and excellent fluidity, resulting in a cured product having low moisture absorption and excellent solder crack resistance.

As a result of various investigations to solve the above-mentioned problems, inventors of the present invention have been able to achieve the object by adding the same amount or less of a 4,4'-biphenol type epoxy resin to a novolak type epoxy resin as an epoxy resin, combining a phenolic resin which achieves low moisture absorption as an epoxy resin hardener, and also adding large quantities of an inorganic filler.

That is, the epoxy resin composition of the present invention comprises:

1. An epoxy resin composition comprising a blend of
   (a) an epoxy resin comprising a mixture of the following components:
      (1) 50–95 parts by weight of a novolak type epoxy resin, and
      (2) 5–50 parts by weight of 4,4'-biphenol type epoxy resin represented by the general formula (I)

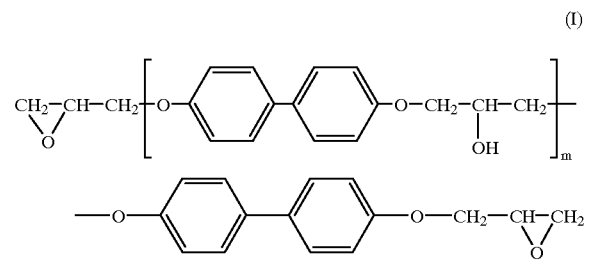

(where the average value of m is a number of about 0–0.5), and (b) a phenolic resin as an epoxy resin hardener represented by the general formula (II)

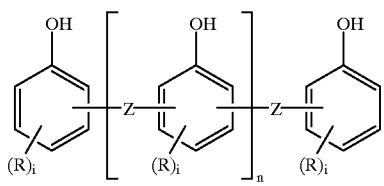

wherein R, which may be the same or different, represents an alkyl group having 1–10 carbon atoms, a substituted or unsubstituted phenyl group, a substituted or unsubstituted aralkyl group, an alkoxyl group or a halogen atom; Z, which may be the same or different, represents a divalent hydrocarbon group having 1–15 carbon atoms, provided that at least one Z is a divalent hydrocarbon group having 5–15 carbon atoms; n is a number of 0–8 on the average value; and i, which may be the same or different, is an integer of 0–3

(c) 80–95% by weight of an inorganic filler of the whole composition, and (d) a curing accelerator, as the essential components.

2. The epoxy resin composition as described in item 1, characterized by using, as the novolak type epoxy resin (1), at least one epoxy resin selected from phenol novolak type epoxy resins, cresol novolak type epoxy resins, and bisphenol A novolak type epoxy resins.

3. The epoxy resin composition as described in item 1 or 2, characterized by using an epoxy resin mixture obtained by reacting a mixture of the novolak type phenolic resin and the 4,4'-biphenol with 3–20 moles, per one mole of phenolic hydroxyl group of the mixture of the phenol compounds, of an epihalohydrin in the presence of an alkali metal hydroxide as a total amount or a part of the epoxy resin in component (a).

4. The epoxy resin composition as described in any one of items 1–3, wherein an epoxy resin other than and in addition to the novolak type epoxy resin and the 4,4'-biphenol type epoxy resin of component (a) is added in an amount of 100 parts by weight or less per 100 parts by weight of the sum of both epoxy resins.

5. The epoxy resin composition as described in any one of items 1–4, characterized by using, as the epoxy resin hardener (b), at least one epoxy resin hardener selected from phenol aralkyl resin, terpene phenolic resin, and dicyclopentadiene phenolic resin.

6. The epoxy resin composition as described in any one of items 1–5, wherein in addition to the phenolic resin represented by the general formula (II), one of another hardener such as polyhydric phenols, polyhydric phenolic resins, acid anhydrides or amines is compounded in an amount of 50% by weight or less to the total amount of the epoxy resin hardeners.

7. The epoxy resin composition as described in any one of items 1–6, wherein the epoxy resin hardener (b) is used in an amount such that the sum of groups reacting with epoxy groups in all epoxy resin hardener components is 0.5–2.0 moles per one mole of epoxy group in all epoxy resin components.

8. The epoxy resin composition as described in any one of items 1–7, characterized by containing a fused and/or crystalline silica powder filler as the inorganic filler (c) in an amount of 83–93% by weight based on the entire composition.

DETAILED DESCRIPTION OF THE INVENTION

The epoxy resin component used in the epoxy resin composition for semiconductor encapsulation of the present invention is given a low melt viscosity while maintaining heat resistance and rapid curability by adding the same amount or less of a 4,4'-biphenol type epoxy resin having the best low melt viscosity and rapid curability characteristics among biphenyl type epoxy resins, to a novolak type epoxy resin. A phenolic resin having hydrocarbon groups, which achieves low moisture absorption is also added, as well as large amounts of inorganic filler, to achieve low moisture absorption and low stress, making it possible to form an epoxy resin composition for semiconductor encapsulation satisfying all of the required characteristics of rapid curability, fluidity, low moisture absorption and solder crack resistance.

The novolak type epoxy resin (1) which is one component of the epoxy resin (a) used in the epoxy resin composition for semiconductor encapsulation of the present invention is an epoxy resin obtained by subjecting a novolak type phenolic resin and an epihalohydrin to a condensation reaction in the presence of an alkali.

This novolak type phenolic resin is a phenolic resin produced by the condensation reaction of various phenol compounds (such as, but not limited to, phenol, cresol, xylenol, ethyl phenol, propyl phenol, butyl phenol, butyl cresol, phenyl phenol, benzyl phenol, methoxyphenol, bromophenol, naphthol, bisphenol A, bisphenol F, bisphenol AD, hydroquinone, dibutylhydroquinone, resorcin, methylresorcin or dihydroxynaphthalene) and formaldehyde, paraformaldehyde, trioxane or the like in the presence of an acidic catalyst.

The reaction of these phenolic resins with an epihalohydrin is carried out via the conventional method, but the representative embodiment thereof is described in detail below. The phenolic resin is dissolved in an epihalohydrin of an amount corresponding to 3–20 mols per one mole of its phenolic hydroxyl group to prepare a uniform solution. An alkali metal hydroxide in an amount of 0.9 to 2 mols per one mole of the phenolic hydroxyl group in the form of solid or aqueous solution is added to this solution while stirring to conduct the reaction. This reaction can be conducted under normal pressure or reduced pressure. The reaction temperature is generally about 30–105° C. in the case of reaction under normal pressure, and about 30–80° C. in the case of reaction under reduced pressure. In the reaction, the reaction liquid is optionally azeotropically distilled while maintaining a fixed temperature, and the condensate obtained by cooling the distilled vapor is separated into an oil layer and a water layer. Water is then removed from the reaction system by a method in which the oil layer separated from the water layer is recirculated into the reaction system. To suppress rapid reaction, the alkali metal hydroxide is added intermittently or continuously with small portions over 1–8 hours. The total reaction time is generally 1–10 hours.

After completion of the reaction, insoluble salts as a by-product are filtered off, or removed by water washing, and unreacted epihalohydrin is distilled off under reduced pressure, thereby obtaining the objective epoxy resin.

The epihalohydrin used in this reaction is generally but not limited to epichlorohydrin, epibromohydrin or the like.

Further, the alkali metal hydroxide used is generally but not limited to NaOH, KOH or the like.

Additionally, in this reaction, there may be used a catalyst of, for example, quaternary ammonium salts such as, but not limited to, tetramethylammonium chloride or tetraethylammonium bromide; tertiary amines such as but not limited to benzyldimethyl amine or 2,4,6-(trisdimethylaminomethyl) phenol; imidazoles such as, but not limited to, 2–ethyl-4-methyl- imidazole or 2-phenylimidazole; phosphonium salts such as but not limited to ethyltriphenylphosphonium iodide; and phosphines such as, but not limited to, triphenyl phosphine.

In this reaction, there may also be used inert organic solvents of, for example, alcohols such as, but not limited to, ethanol, isopropanol or the like; ketones such as, but not limited to, acetone or methyl ethyl ketone; ethers such as, but not limited to, dioxane, ethylene glycol dimethyl ether or the like; glycol ethers such as, but not limited to, methoxypropanol or the like; and aprotic polar solvents such as, but not limited to, dimethylsulfoxide, dimethylformamide or the like.

If the saponified halogen content of the resulting epoxy resin is too high, the epoxy resin may be re-treated to obtain a purified epoxy resin having a sufficiently decreased saponified halogen content. That is, the crude epoxy resin is again dissolved in an inert organic solvent such as, but not limited to, isopropanol, methyl ethyl ketone, methyl isobutyl ketone, toluene, xylene, dioxane, methoxypropanol or dimethylsulfoxide, and an alkali metal hydroxide in the form of a solid or aqueous solution is added to conduct the re-cyclization reaction at a temperature of about 30–120° C. for 0.5–8 hours. Then, excess alkali metal hydroxide or by-produced salts are removed by a method of, for example, water washing, and the organic solvent is also removed through distillation under reduced pressure, thereby obtaining a purified epoxy resin.

Of the various novolak epoxy resins thus obtained, at least one kind of epoxy resin selected from phenol novolak type epoxy resins, cresol novolak type epoxy resins and bisphenol A novolak type epoxy resins is preferable for easy availability, cured properties, and the like.

The 4,4'-biphenol type epoxy resin (2) which is the other component of the epoxy resin (a) used in the present invention is an epoxy resin obtained by the condensation reaction of 4,4'-biphenol with an epihalohydrin in the presence of an alkali in a manner similar to that of the novolak type epoxy resin (1). The structure is represented by the following general formula (I). The average value of m in the formula is preferably about 0–0.5, and more preferably about 0–0.3, in order to maintain low melt viscosity.

General Formula (I)

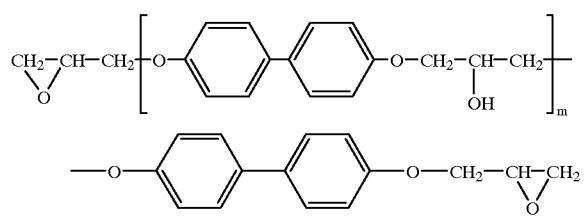

(where the average value of m is about 0–0.5)

The epoxy resin (a) used in the epoxy resin composition for semiconductor encapsulation of the present invention may be used by separately producing or getting the novolak type epoxy resin (1) and 4,4'-biphenol type epoxy resin (2), and mixing those, or may be used as a mixture of the respective epoxy resins by mixing the novolak type phenolic resin and 4,4'-biphenol which are the respective raw materials, and simultaneously reacting with an epihalohydrin. The latter method is preferable in order to obtain an epoxy resin having good compatibility with a hardener or the like. In the case of using the latter method, it is necessary to previously adjust proportions of the respective raw materials such that the mixing ratio of the novolak type epoxy resin (1) and 4,4'-biphenol type epoxy resin (2) after epoxidation is the desired ratio, or it is necessary to adjust proportions to match the desired ratio by adding either or both of the epoxy resins after epoxidation.

The mixing ratio of the novolak type epoxy resin (1) and the 4,4'-biphenol type epoxy resin is 50–95 parts by weight of the novolak type epoxy resin (1) and 5–50 parts by weight of 4,4'-biphenol type epoxy resin. This ratio is preferably 60–90 parts by weight of the novolak type epoxy resin (1) and 10–40 parts by weight of the 4,4'-biphenol type epoxy resin. If the amount of the 4,4'-biphenol type epoxy resin used is too small, heat resistance and rapid curability properties are excellent, but melt viscosity is increased. On the other hand, if the amount of the 4,4'-biphenol type epoxy resin used is too large, the melt viscosity is decreased, but heat resistance and rapid curability properties are poor.

Further, epoxy resins other than the novolak type epoxy resin (1) and 4,4'-biphenol type epoxy resin (2) can be added for use as the epoxy resin composition for semiconductor encapsulation of the present invention.

The other epoxy resins which can be added include but are not limited to epoxy resins produced from various phenol type compounds and epihalohydrin, epoxy resins produced from various amine compounds and epihalohydrin, and epoxy resins produced from various carboxylic acids and epihalohydrin. The various phenol type compounds include but are not limited to various phenols and polyhydric phenolic resins obtained by the condensation reaction of various phenols with various aldehydes, wherein various phenols include but are not limited to bisphenol A, bisphenol F, bisphenol AD, hydroquinone, methylhydroquinone, dibutylhydroquinone, resorcin, methylresorcin, dihydroxydiphenyl ether, and dihydroxynaphthalene, and various aldehydes include, but are not limited to, hydroxybenzaldehyde, crotonealdehyde, glyoxal and the like. Various amine compounds include, but are not limited to, diaminodiphenyl methane, aminophenol, xylene diamine and the like. Various carboxylic acids include, but are not limited to, methylhexahydrophthalic acid, dimer acid and the like.

Further, to impart flame retardancy to the composition, a brominated epoxy resin such as, but not limited to, brominated bisphenol A type epoxy resin or brominated phenol novolak type epoxy resin can be added.

The proportion of these other epoxy resins used is preferably 100 parts by weight or less, and more preferably 50 parts by weight or less, per 100 parts by weight of the sum of the novolak type epoxy resin (1) and 4,4'-biphenol type epoxy resin (2). If the proportion of the other epoxy resins used is too large, the effect of the present invention is not sufficiently exhibited.

The epoxy resin hardener (b) is the essential component in the present epoxy resin composition. A phenolic resin represented by the following general formula (II) is used as this epoxy resin hardener.

General Formula (II)

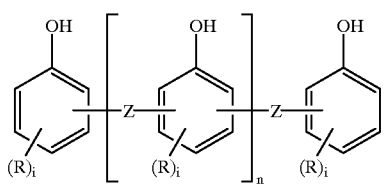

(wherein R, which may be the same or different, represents an alkyl group having 1–10 carbon atoms, a substituted or unsubstituted phenyl group, a substituted or unsubstituted aralkyl group, an alkoxyl group or a halogen atom; Z, which may be the same or different, represents a divalent hydrocarbon group having 1–15 carbon atoms, provided that at least one Z is a divalent hydrocarbon group having 5–15 carbon atoms; n is a number of 0–8 on the average value; and i, which may be the same or different, is an integer of 0–3.

The phenolic resin represented by the general formula (II) consists of divalent hydrocarbon groups linking each phenol nucleus, in which at least one group is a group having 5 or more carbon atoms.

The production method of the phenolic resin having hydrocarbon groups between phenol nuclei is not particularly limited. The general method used involves forming an oligomer using a reaction such as an addition condensation reaction of various phenol compounds and carbonyl group, an addition reaction of an unsaturated bond, or a condensation reaction with α-hydroxyalkylbenzenes, α-alkoxyalkylbenzenes or α-halogenated alkylbenzenes, thereby forming a resin.

Illustrative examples of the phenol compounds used here include, but are not limited to, phenol, cresol, xylenol, ethyl phenol, propyl phenol, butyl phenol, butyl cresol, phenyl phenol, benzyl phenol, methoxyphenol, bromophenol, bisphenol A, bisphenol F, bisphenol Z, biphenol, and terpene diphenol.

The compounds having a carbonyl group used for oligomerizing those phenol compounds are various aldehydes or ketones, and examples thereof include, but are not limited to, formaldehyde, acetaldehyde, propion aldehyde, butyl aldehyde, benzaldehyde, acetone, cyclohexanone, isophorone, 3,3,5-trimethylcyclohexane, acetophenone, naphthoaldehyde and fluorenone.

Illustrative examples of the compounds having an unsaturated bond include, but are not limited to, divinylbenzene, diisopropenylbenzene, dicyclopentadiene, norbornene and terpene.

Further, α-hydroxyalkylbenzenes, α-alkoxyalkylbenzenes or α-halogenated alkylbenzenes include, but not limited to, α,α'-dihydroxyxylene, α,α'-dihydroxyisopropylbenzene, α,α'-dimethoxyxylene, α,α'-dimethoxydiisopropylbenzene, 4,4'-dihydroxymethylbiphenyl, 4,4'-dimethoxymethybiphenyl, and α,α'-dichloroxylene.

Those compounds having a carbonyl group or unsaturated bond, α-hydroxyalkylbenzenes, α-alkoxyalkylbenzenes or α-halogenated alkylbenzenes, are used alone or as mixtures of two or more thereof. Since the structure of the divalent hydrocarbon group [—Z— in the above-mentioned general formula (II)] linking each phenol nucleus of the objective phenolic resin is determined by the selection of those compounds, they must be selected such that at least one Z in all Zs in the resin formed has 5 or more carbon atoms.

The reaction of the compounds having a carbonyl group or unsaturated bond, α-hydroxyalkylbenzenes, α-alkoxyalkylbenzenes or α-halogenated alkylbenzenes, for oligomerizing the phenol compound to form a resin can be conducted using a general reaction method. That is, the reaction is conducted at a temperature of about 20–200° C. for about 1–20 hours in the presence of an acidic catalyst.

Of various phenolic resins having a hydrocarbon group introduced between phenol nuclei, phenol aralkyl resin, terpene phenol resin, dicyclopentadiene phenolic resin and the like are preferable due to easy availability, cured properties, and the like.

Hardeners other than the phenolic resin represented by the general formula (II) can also be used for the epoxy resin composition of the present invention.

Illustrative examples of the other hardeners which can be added include, but are not limited to, various polyhydric phenols such as bisphenol A, bisphenol F, bisphenol AD, hydroquinone, resorcin, methylresorcin, biphenol, tetramethylbiphenol, dihydroxynaphthalene, dihydroxydiphenyl ether, phenol novolak resin, cresol novolak resin, bisphenol A novolak resin, naphthol novolak resin, brominated bisphenol A or brominated phenol novolak resin; phenolic resins of various phenols such as polyhydric phenolic resins obtained by the polycondensation reaction of various phenols with various aldehydes (such as hydroxybenzaldehyde, croton aldehyde, glyoxal and the like); active ester compounds which are obtained by esterifying (such as benzoating or acetating) all or part of phenolic hydroxyl groups in those various phenols (phenolic resins); acidic anhydrides such as methyltetrahydrophthalic anhydride, hexahydrophthalic anhydride, pyromellitic anhydride or methyl nadic acid; and amines such as diethylene triamine, isophorone diamine, diaminodiphenyl methane, diaminodiphenylsulfone or dicyandiamide.

The proportion used of those other hardeners is preferably about 50% by weight or less per 100 parts by weight of the total amount of the epoxy resin hardeners. If the proportion used of the hardeners other than the epoxy resin hardener of the present invention is too large, the effect of the present invention is not sufficiently exhibited.

The amount of the epoxy resin hardener used (b) in the epoxy resin composition for semiconductor encapsulation of the present invention is an amount such that the sum of groups reacting with epoxy groups of the total epoxy resin hardener components is preferably about 0.5–2.0 mols, and more preferably about 0.7–1.2 mols, per one mole of epoxy groups in the total epoxy resin components.

An inorganic filler (c) is compounded in the epoxy resin composition for semiconductor encapsulation of the present invention. Illustrative examples of the inorganic filler include, but not limited to, fused silica, crystalline silica, glass powder, alumina and calcium carbonate. The shape can be crushed form or spherical form. Various inorganic fillers can be used alone or as mixtures of two or more thereof. Of those, fused silica or crystalline silica is preferable. The amount used is about 80–95% by weight, and more preferably about 83–93% by weight, of the whole composition.

If the amount of the inorganic filler (c) used is too small, the improvement in low moisture absorption and low stress property is small, resulting in poor solder crack resistance. If the amount used of the inorganic filler (c) is too large, fluidity when molding is impaired.

The curing accelerator (d) used in the epoxy resin composition for semiconductor encapsulation of the present invention is a compound which promotes the reaction between epoxy groups in the epoxy resin and active groups in the hardener.

Examples of the curing accelerator (d) include, but not limited to, phosphine compounds such as tributyl phosphine, triphenyl phosphine, tris(dimethoxyphenyl)phosphine or tris(hydroxypropyl)phosphine, tris(cyanoethyl)phosphine; phosphonium salts such as tetraphenylphosphonium tetraphenylborate, methyltributylphosphonium tetraphenylborate or methyltricyanoethylphosphonium tetraphenylborate; imidazoles such as 2-methylimidazole, 2-phenylimidazole, 2-ethyl-4-methylimidazole, 2-undecylimidazole, 1-cyanoethyl-2-methylimidazole, 2,4-dicyano-6-[2-methylimidazolyl-(1)]-ethyl-S-triazine or 2,4-dicyano-6-[2-undecylimidazolyl-(1)]-ethyl-S-triazine; imidazolium salts such as 1-cyanoethyl-2-undecylimidazolium trimellitate, 2-methylimidazolium isocyanurate, 2-ethyl-4-methylimidazolium tetraphenylborate or 2-ethyl-1,4-dimethylimidazolium tetraphenylborate; amines such as 2,4,6-tris(dimethylaminomethyl)phenol, benzyldimethylamine, tetramethylbutylguanidine, N-methylpiperazine or 2-dimethylamino-1-pyrroline; ammonium salts such as triethylammonium tetraphenylborate; diazabicyclo compounds such as 1,5-diazabicyclo(5,4,0)-7-undecene, 1,5-diazabicyclo (4,3,0)-5-nonene or 1,4-diazabicyclo(2,2,2)-octane; and tetraphenyl borates, phenol salts, phenol novolak salts or 2-ethylhexanoic acid salts of those diazabicyclo compounds.

Of the compounds acting as the curing accelerator, phosphine compounds, imidazole compounds, diazabicyclo compounds, and their salts are preferable.

These curing accelerators (d) are used alone or as mixtures of two or more thereof, and the amount used is preferably about 0.1–7% by weight to the epoxy resin (a), and more preferably about 1–5% by weight.

Coupling agents, plasticizers, pigments or the like can be compounded in the epoxy resin composition for semiconductor encapsulation of the present invention as required.

Further, antimony trioxide, phosphoric acid or the like can also be compounded as a flame–retardant assistant.

The epoxy resin composition for semiconductor encapsulation of the present invention has excellent rapid curability and fluidity, and also gives a cured product having excellent solder crack resistance. Therefore, it can advantageously be used in the field of semiconductor encapsulation.

EXAMPLES

The present invention is described in more detail by referring to the production examples of each epoxy resin used in the epoxy resin composition for semiconductor encapsulation of the present invention, and also examples and comparative examples of the epoxy resin composition for semiconductor encapsulation of the present invention. These examples are meant for illustrative purposes only and are not to be construed as limiting the scope of the present invention.

Production Examples 1–3 of Each Epoxy Resin

A phenol compound in a kind and an amount as shown in Table 1, 1300 g of epichlorohydrin and 500 g of methoxypropanol were charged in a 3 liter three–necked flask equipped with a thermometer, a stirrer and a cooling pipe, and the temperature was raised to 50° C. to uniformly dissolve the components. 190 g of 48.5 wt % sodium hydroxide aqueous solution was added dropwise over 1 hour. During the dropwise addition, the temperature was gradually raised such that the inside temperature of the system reached 70° C. at the time of completion of the dropwise addition. Thereafter, the reaction was conducted while maintaining the temperature at 70° C. for 30 minutes. After completion of the reaction, salts as a by-product and excess sodium hydroxide were removed by water washing. Excess epichlorohydrin and methoxypropanol were distilled off from the product under reduced pressure to obtain a crude epoxy resin.

This crude epoxy resin was dissolved in 700 g of methyl isobutyl ketone, 6 g of 48.5 wt % sodium hydroxide aqueous solution was added, and the reaction was conducted at a temperature of 80° C. for 1 hour. After completion of the reaction, primary sodium phosphate was added to neutralize excess sodium hydroxide, followed by water washing to remove by-produced salts. Methyl isobutyl ketone was completely removed under reduced pressure to obtain the objective epoxy resin.

Composition, epoxy equivalent and melt viscosity of those epoxy resins are shown in Table 1.

Examples 1–6 and Comparative Examples 1–4 of Epoxy Resin Composition for Semiconductor Encapsulation Each epoxy resin composition was compounded using the respective blend, wherein for each epoxy resin produced in Production Examples 1–3, a commercially available cresol novolak type epoxy resin, commercially available bisphenol A novolak type epoxy resin and/or commercially available tetramethylbiphenyl type epoxy resin was used as each component of the epoxy resin (a); brominated bisphenol A type epoxy resin was used as a flame retardant; phenol aralkyl resin, terpene phenolic resin, dicyclopentadiene resin or phenol novolak resin was used as an epoxy resin hardener (b); spherical fused silica powder was used as an inorganic filler (c) in an amount of 85% by weight of the whole composition except for Comparative Example 1 and 78% by weight of the whole composition in Comparative Example 1; triphenylphosphine was used as a curing accelerator (d); antimony trioxide was used as a flame retardant assistant; epoxysilane was used as a surface treating agent for fillers; and carnauba wax was used as a release agent.

Each blend was melted and kneaded at a temperature of 70–130° C. for 5 minutes using a mixing roll. Each molten mixture obtained was formed into a sheet, and the sheet was then pulverized to obtain each molding material. Gel time at 180° C. of each molding material was measured.

Each molding material was molded with a low pressure transfer molding machine at a mold temperature of 180° C. for a molding time of 180 seconds to obtain each test piece, and the test piece was post–cured at 180° C. for 8 hours. Spiral flow of each molding material was measured.

Each molding material was tested for gel time and spiral flow, and each test piece after post-curing was tested for glass transition temperature, moisture absorption and solder crack resistance. The results obtained are shown in Table 2. Each molding material of Examples 1–6 was excellent with respect to rapid curability (that is, short gel time), fluidity (that is, high spiral flow), low moisture absorption and solder crack resistance as compared to molding materials of Comparative Examples 1–4.

TABLE 1

| | Production Example | | |
|---|---|---|---|
| Amount of phenol Compound (g) 4,4'-biphenol | 188 | 47.0 | 65.8 |
| Cresol novolak resin 1* | — | 180.0 | — |
| Bisphenol A novolak resin 2* | — | — | 156.0 |
| Epoxy resin composition (wt %) 3* | 0 | 77.9 | 68.5 |
| Novolak type epoxy resin | | | |
| 4,4-Biphenol type epoxy resin | 100 | 22.1 | 31.5 |
| Analytical result of epoxy resin | 162 | 189 | 185 |
| Epoxy equivalent | | | |
| Melt viscosity (PS) at 150° C. | 0.1 | 0.3 | 0.5 |

(Notes)
*1: A product of Asahi Yuukizai Co., softening point: 75° C.
*2: A product of Meiwa Kasei Co., softening point: 98° C.
*3: Calculated from amount of raw materials charged The epoxy resin composition for semiconductor encapsulation of the present invention has excellent rapid curability and fluidity, and also gives a cured product having excellent low moisture absorption and solder crack resistance. Therefore, the epoxy resin composition can advantageously be used for semiconductor encapsulation.

What is claimed is:

1. An epoxy resin composition comprising:

(a) an epoxy resin mixture comprising:
(1) about 50–95 parts by weight of a novolak type epoxy resin, and
(2) about 5–50 parts by weight of a 4,4'-biphenol type epoxy resin represented by the general formula (I):

TABLE 2

| Formulation of epoxy resin composition | | Examples | | | | | | Comparative Examples | | | |
|---|---|---|---|---|---|---|---|---|---|---|---|
| (part by weight) | | 1 | 2 | 3 | 4 | 5 | 6 | 1 | 2 | 3 | 4 |
| Epoxy resin | | | | | | | | | | | |
| Novolak type epoxy resin | | A*1 | B*1 | *3 | *4 | *5 | *6 | A*1 | — | A*1 | A*1 |
| Amount | | 75 | 85 | 77.9 | 66.2 | 82.3 | 68.5 | 100 | 0 | 75 | 40 |
| 4,4'-biphenol type epoxy resin | | P.E.1** | P.E.1** | *3 | *4 | *5 | *6 | — | C*7 | P.E.1** | C*7 |
| Amount | | 25 | 15 | 22.1 | 33.8 | 17.7 | 31.5 | 0 | 100 | 25 | 60 |
| Brominated epoxy resin | *8 | 10 | 10 | 10 | 10 | 10 | 10 | 10 | 10 | 10 | 10 |
| Epoxy resin hardener | | D*9 | E*10 | D*9 | F*11 | D*9 | D*9 | G*12 | D*9 | G*12 | D*9 |
| Amount | | 91 | 93 | 94 | 97 | 93 | 96 | 52 | 93 | 55 | 90 |
| Inorganic filler | *13 | 1215 | 1224 | 1232 | 1244 | 1222 | 1243 | 619 | 1224 | 1011 | 1207 |
| Triphenylphosphine | | 1 | 1 | 1 | 1 | 1 | 1 | 1 | 1 | 1 | 1 |
| Antimony trioxide | | 10 | 10 | 10 | 10 | 10 | 10 | 10 | 10 | 10 | 10 |
| Carnauba wax | | 1 | 1 | 1 | 1 | 1 | 1 | 1 | 1 | 1 | 1 |
| Epoxy silane | *14 | 1 | 1 | 1 | 1 | 1 | 1 | 1 | 1 | 1 | 1 |
| Curability, gel time (sec) | | 54 | 51 | 51 | 57 | 50 | 56 | 45 | 82 | 58 | 78 |
| Fluidity, spiral flow (cm) | | 84 | 80 | 82 | 85 | 82 | 84 | 76 | 88 | 79 | 85 |
| Cured properties | | | | | | | | | | | |
| Glass transition temperature (° C.) | *15 | 148 | 156 | 150 | 147 | 150 | 152 | 156 | 126 | 152 | 134 |
| Moisture absorption | *16 | 0.21 | 0.22 | 0.21 | 0.20 | 0.19 | 0.22 | 0.37 | 0.25 | 0.29 | 0.24 |
| Solder crack resistance | *17 | 0/16 | 0/16 | 0/16 | 0/16 | 0/16 | 0/16 | 16/16 | 3/16 | 13/16 | 5/16 |

**P.E. denotes 'Production Example'
(Notes)
*1: A; Cresol novolak type epoxy resin (trade name "Epikote 180S62", a product of Yuka Shell Epoxy K.K., epoxy equivalent: 210)
*2: B; Bisphenol A novolak type epoxy resin (trade name "Epikote 157S65", a product of Yuka Shell Epoxy K.K., epoxy equivalent: 206)
*3: Epoxy resin (mixture) produced in Production Example 2 was used.
*4: 85.0 parts by weight of epoxy resin (mixture) produced in Production Example 2 and 15.0 parts by weight of epoxy resin produced in Production Example 1 were mixed and used.
*5: 80.0 parts by weight of epoxy resin (mixture) produced in Production Example 2 and 20.0 parts by weight of cresol novolak type epoxy resin were mixed and used.
*6: Epoxy resin (mixture) produced in Production Example 3 was used.
*7: C; Tetramethyl biphenyl type epoxy resin (trade name "Epikote YX4000H", a product of Yuka Shell Epoxy K.K., epoxy equivalent: 192). This resin C is not 4,4'-biphenol resin.
*8: Brominated bisphenol A type epoxy resin (trade name "Epikote 5050", a product of Yuka Shell Epoxy K.K., epoxy equivalent: 385, bromine content: 49%)
*9: D; Phenol aralkyl resin (trade name "XL225-3L", a product of Mitsui-Toatsu Corp., hydroxyl equivalent: 170, softening point: 71° C.)
*10: E; Terpene phenolic resin (trade name "Epikure MP402FPY", a product of Yuka Shell Epoxy K.K., hydroxyl equivalent: 175, softening point: 125° C.)
*11: F; Dicyclopentadiene phenolic resin (trade name "DDP-M", a product of Nippon Petrochemical Co., Ltd., hydroxyl equivalent: 170, softening point: 95° C.)
*12: G; Phenol novolak resin (a product of Gun-ei Kagaku Co., Ltd., hydroxyl equivalent: 103, softening point: 85° C.)
*13: Spherical fused silica powder (trade name "ELSIL BF100", a product of Nippon Aerosil Co., Ltd.)
*14: Epoxysilane (trade name "KBM-403", a product of Shin-Etsu Chemical Industry Co., Ltd.)
*15: Obtained by TMA from the transition point on the thermal expansion curve
*16: Moisture absorption at 85° C. and 85% RH for 300 hours
*17: 16 test pieces (80-pin QFP) were allowed to absorb moisture at 85° C. and 85% RH for 300 hours and then dipped in a solder bath at 260° C. for 10 seconds, and the number of cracked test pieces was counted.

(I)

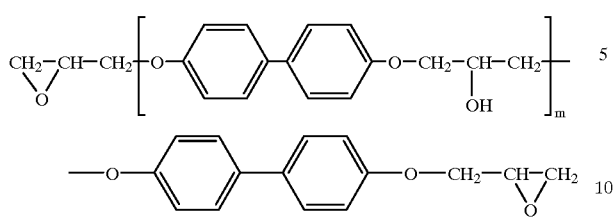

wherein an average value of m is about 0–0.5; and (b) an epoxy resin hardener represented by the general formula (II):

(II)

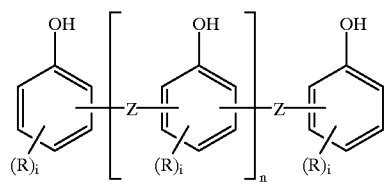

wherein R, which may be the same or different, represents an alkyl group having 1–10 carbon atoms, a substituted or unsubstituted phenyl group, a substituted or unsubstituted aralkyl group, an alkoxyl group, or a halogen atom; Z, which may be the same or different, represents a divalent hydrocarbon group having 1–15 carbon atoms, provided that at least one Z is a divalent hydrocarbon group having 5–15 carbon atoms; n is a number of 0–8 on the average value; and i, which may be the same or different, is an integer of 0–3, wherein the epoxy resin hardener is used in an amount such that the sum of groups reacting with epoxy groups in all epoxy resin hardener components is about 0.5–2.0 moles per one mole of epoxy group in all epoxy resin components;

(c) about 80–95% by weight of an inorganic filler of the whole composition; and (d) a curing accelerator.

2. The composition of claim 1, wherein the novolak type epoxy resin of (a)(1), is selected from the group consisting of phenol novolak type epoxy resins, cresol novolak type epoxy resins, and bisphenol A novolak type epoxy resins.

3. An epoxy resin composition comprising:

(a) an epoxy resin mixture comprising:

(1) about 50–95 parts by weight of a novolak type epoxy resin, and (2) about 5–50 parts by weight of a 4,4'-biphenol type epoxy resin represented by the general formula (I):

(I)

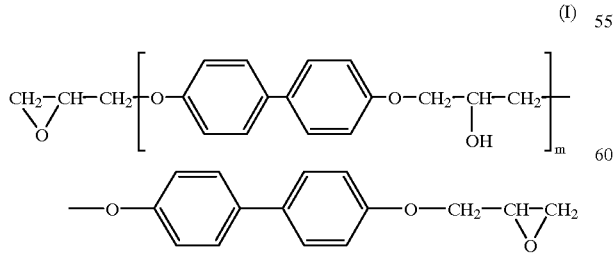

wherein an average value of m is about 0–0.5, and wherein the epoxy resin mixture is obtained by reacting a mixture of the novolak type phenolic resin and the 4,4'-biphenol with 3–20 moles, per one mole of phenolic hydroxyl group of the mixture of the phenol compounds, of an epihalohydrin in the presence of an alkali metal hydroxide as a total amount or a part of the epoxy resin mixture; and (b) an epoxy resin hardener represented by the general formula (II):

(II)

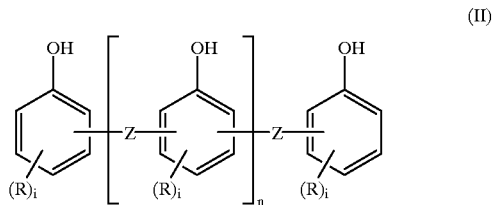

wherein R, which may be the same or different, represents an alkyl group having 1–10 carbon atoms, a substituted or unsubstituted phenyl group, a substituted or unsubstituted aralkyl group, an alkoxyl group, or a halogen atom; Z, which may be the same or different, represents a divalent hydrocarbon group having 1–15 carbon atoms, provided that at least one Z is a divalent hydrocarbon group having 5–15 carbon atoms; n is a number of 0–8 on the average value; and i, which may be the same or different, is an integer of 0–3;

(c) about 80–95% by weight of an inorganic filler of the whole composition; and (d) a curing accelerator.

4. The composition of claim 1, wherein an epoxy resin other than and in addition to the novolak type epoxy resin and the 4,4'-biphenol type epoxy resin of component (a) is added in an amount of 100 parts by weight or less per 100 parts by weight of the sum of both epoxy resins.

5. An epoxy resin composition comprising:

(a) an epoxy resin mixture comprising:

(1) about 50–95 parts by weight of a novolak type epoxy resin, and (2) about 5–50 parts by weight of a 4,4'-biphenol type epoxy resin represented by the general formula (I):

(I)

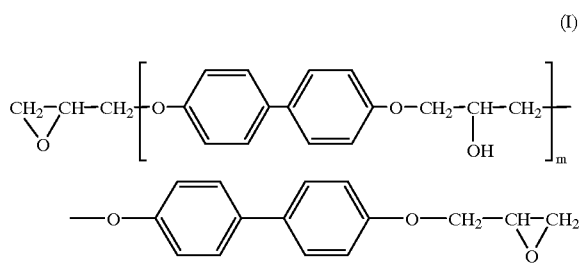

wherein an average value of m is about 0–0.5; and (b) an epoxy resin hardener represented by the general formula (II):

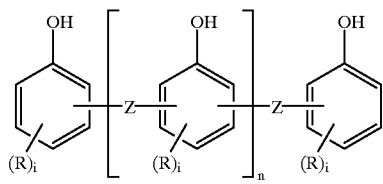

(II)

wherein R, which may be the same or different, represents an alkyl group having 1–10 carbon atoms, a substituted or unsubstituted phenyl group, a substituted or unsubstituted aralkyl group, an alkoxyl group, or a halogen atom; Z, which may be the same or different, represents a divalent hydrocarbon group having 1–15 carbon atoms, provided that at least one Z is a divalent hydrocarbon group having 5–15 carbon atoms; n is a number of 0–8 on the average value; and i, which may be the same or different, is an integer of 0–3, and wherein the epoxy resin hardener is phenol aralkyl resin, terpene phenolic resin, dicyclopentadiene phenolic resin, or a mixture thereof;

(c) about 80–95% by weight of an inorganic filler of the whole composition; and (d) a curing accelerator.

6. The epoxy resin composition of claim 1, wherein in addition to the phenolic resin represented by the general formula (II), one of another hardener chosen from the group consisting of polyhydric phenols, polyhydric phenolic resins, acid anhydrides and amines is compounded in an amount of about 50% by weight or less to the total amount of the epoxy resin hardeners.

7. The composition of claim 1, wherein the inorganic filler (c) is a fused silica powder filler, a crystalline silica powder filler or a mixture thereof, in an amount of about 83–93% by weight based on the entire composition.

8. The composition of claim 3, wherein said novolak type epoxy resin is selected from phenol novolak type epoxy resins, cresol novolak type epoxy resins, or bisphenol A novolak type epoxy resins.

9. The composition of claim 3, wherein an epoxy resin other than and in addition to the novolak type epoxy resin and the 4,4'-biphenol type epoxy resin of component (a) is added in an amount of about 100 parts by weight or less per 100 parts by weight of the sum of both epoxy resins.

10. The composition of claim 3, wherein the epoxy resin hardener (b), is phenol aralkyl resin, terpene phenolic resin, dicyclopentadiene phenolic resin or a mixture thereof.

11. The composition of claim 3, wherein in addition to the phenolic resin represented by the general formula (II), one of another hardener chosen from the group consisting of polyhydric phenols, polyhydric phenolic resins, acid anhydrides and amines is compounded in an amount of 50% by weight or less to the total amount of the epoxy resin hardeners.

12. The composition of claim 3, wherein the epoxy resin hardener (b) is used in an amount such that the sum of groups reacting with epoxy groups in all epoxy resin hardener components is 0.5–2.0 moles per one mole of epoxy group in all epoxy resin components.

13. The composition of claim 3, wherein the inorganic filler (c) is a fused silica powder filler, a crystalline silica powder filler or a mixture thereof in an amount of about 83–93% by weight based on the entire composition.

14. The composition of claim 8, wherein an epoxy resin other than and in addition to the novolak type epoxy resin and the 4,4'-biphenol type epoxy resin of component (a) is added in an amount of 100 parts by weight or less per 100 parts by weight of the sum of both epoxy resins.

15. The composition of claim 8, wherein the epoxy resin hardener (b) is phenol aralkyl resin, terpene phenolic resin, dicyclopentadiene phenolic resin or a mixture thereof.

16. The composition of claim 8, wherein in addition to the phenolic resin represented by the general formula (II), one of another hardener chosen from the group consisting of polyhydric phenols, polyhydric phenolic resins, acid anhydrides and amines is compounded in an amount of about 50% by weight or less to the total amount of the epoxy resin hardeners.

17. The composition of claim 8, wherein the epoxy resin hardener (b) is used in an amount such that the sum of groups reacting with epoxy groups in all epoxy resin hardener components is about 0.5–2.0 moles per one mole of epoxy group in all epoxy resin components.

18. The composition of claim 8, wherein the inorganic filler (c) comprises a fused silica powder filler, a crystalline silica powder filler or a mixture thereof in an amount of about 83–93by weight based on the entire composition.

19. An epoxy resin composition for semiconductor encapsulation comprising:

(a) an epoxy resin mixture comprising:
(1) about 60–90 parts by weight of a novalak type epoxy resin selected from the group consisting of phenol novolak type epoxy resins, cresol novolak type epoxy resins, and bisphenol A novolak type epoxy resins;
(2) about 10–40 parts by weight of a 4,4'-biphenol type epoxy resin represented by the general formula (I)

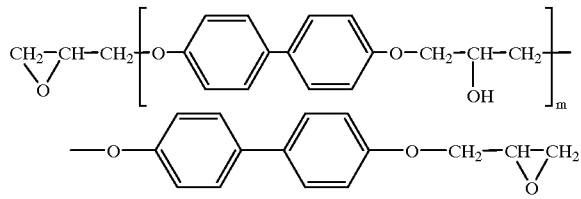

(I)

wherein an average value of m is about 0–0.5; and said mixture is obtained by reacting a mixture of the novolak type phenolic resin and the 4,4'-biphenol with 3–20 moles per one mole of phenolic hydroxyl group of the mixture of the phenol compounds of an epihalohydrin in the presence of an alkali metal hydroxide as a total amount or a part of the epoxy resin of component (a), (b) an epoxy resin hardener chosen from the group consisting of phenol aralkyl resin, terpene phenolic resin, dicyclopentadiene phenolic resin and a mixture thereof in an amount such that the sum of groups reacting with epoxy groups in all epoxy resin hardener components is about 0.5–2.0 moles per one mole of epoxy group in all epoxy resin components;

(c) a fused silica powder filler, a crystalline silica powder filler or a mixture thereof, in an amount of about 83–93% by weight based on the entire composition;

(d) about 1–5% by weight to (a) of a curing accelerator selected from the group consisting of phosphine compounds, imidazole compounds, diazabicyclo compounds and their salts;

(e) a coupling agent;

(f) a plasticizer;

(g) pigments; and (h) a flame retardant assistant.

* * * * *